Figure 1:
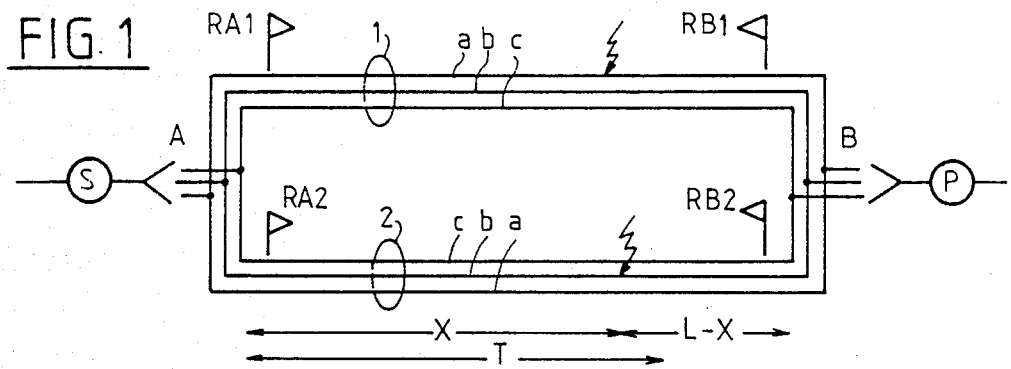

United States Patent [19]

Heller

[11] Patent Number: 4,833,414

[45] Date of Patent: May 23, 1989

[54] METHOD AND APPARATUS FOR THE IDENTIFICATION OF A FAULTY CONDUCTOR IN A MULTIPLE SUPPLY LINE

[75] Inventor: Isabelle Heller, Meudon, France

[73] Assignee: Enertec, Montrouge, France

[21] Appl. No.: 937,296

[22] Filed: Dec. 3, 1986

[30] Foreign Application Priority Data

Dec. 4, 1985 [FR] France .................................. 85 17914

[51] Int. Cl.$^4$ ...................... G01R 31/08; G01R 19/00
[52] U.S. Cl. ................................. 324/522; 324/524; 324/539; 324/509; 364/483; 361/87
[58] Field of Search ................ 324/508, 509, 520–522, 324/524, 539, 541; 361/44, 47, 63, 87; 364/483, 492; 340/651, 664; 307/44, 60

[56] References Cited

U.S. PATENT DOCUMENTS

| | | | |
|---|---|---|---|
| 4,251,766 | 2/1981 | Sovillard | 324/522 X |
| 4,275,429 | 6/1981 | Church et al. | 361/87 X |
| 4,513,340 | 4/1985 | Drain | 361/87 X |
| 4,618,779 | 10/1986 | Wiscombe | 364/492 X |

Primary Examiner—Reinhard J. Eisenzopf
Assistant Examiner—Jack B. Harvey
Attorney, Agent, or Firm—Sughrue, Mion, Zinn, Macpeak & Seas

[57] ABSTRACT

A method of and apparatus for determining which if any phase of duplex supply lines wherein each phase w is assigned two conductors w1 and w2. The method and apparatus use an asymmetry value, for example a function of the relationship (output of 9) of the difference Iw1−Iw2 (output of 5) to the sum Iw1+Iw2 (output of 6) of the currents in the conductors w1 and w2. If the asymmetry level exceeds in absolute value a threshold level K(see 12 and 13), the conductor passing the current having the lowest amplitude is indicated as being sound.

12 Claims, 5 Drawing Sheets

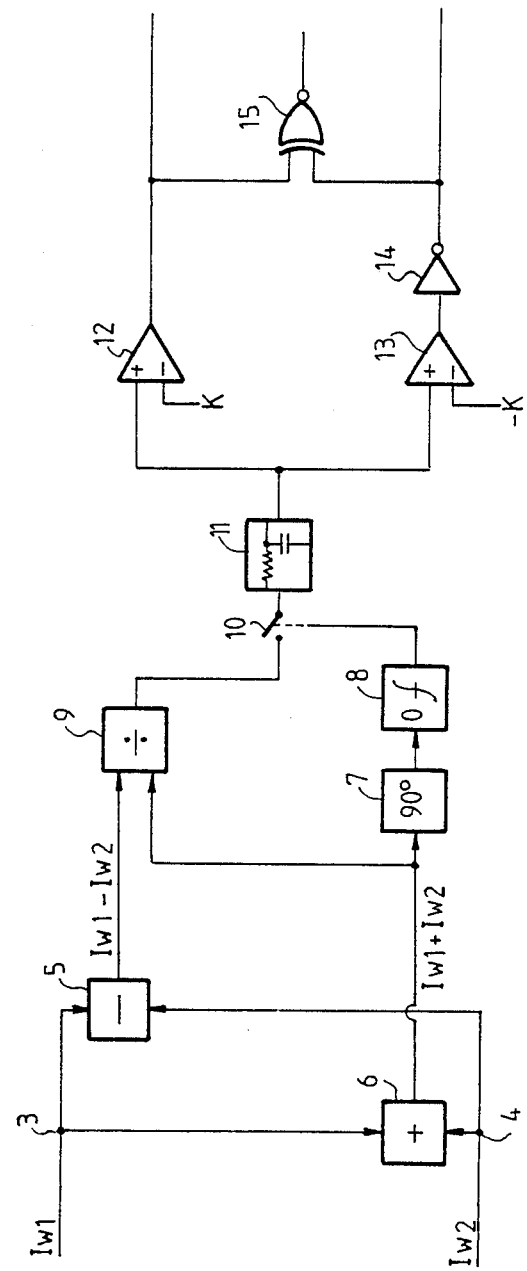

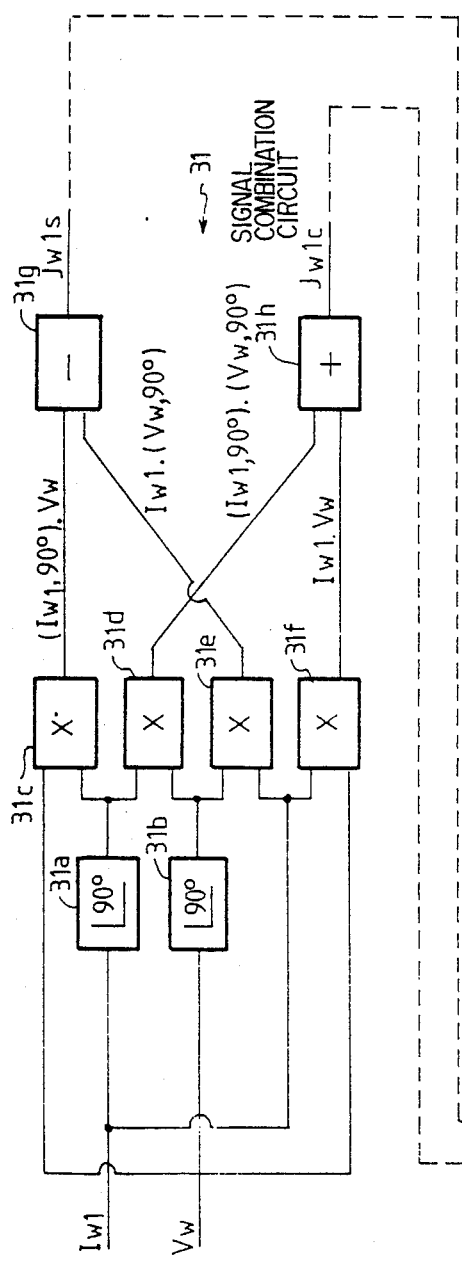
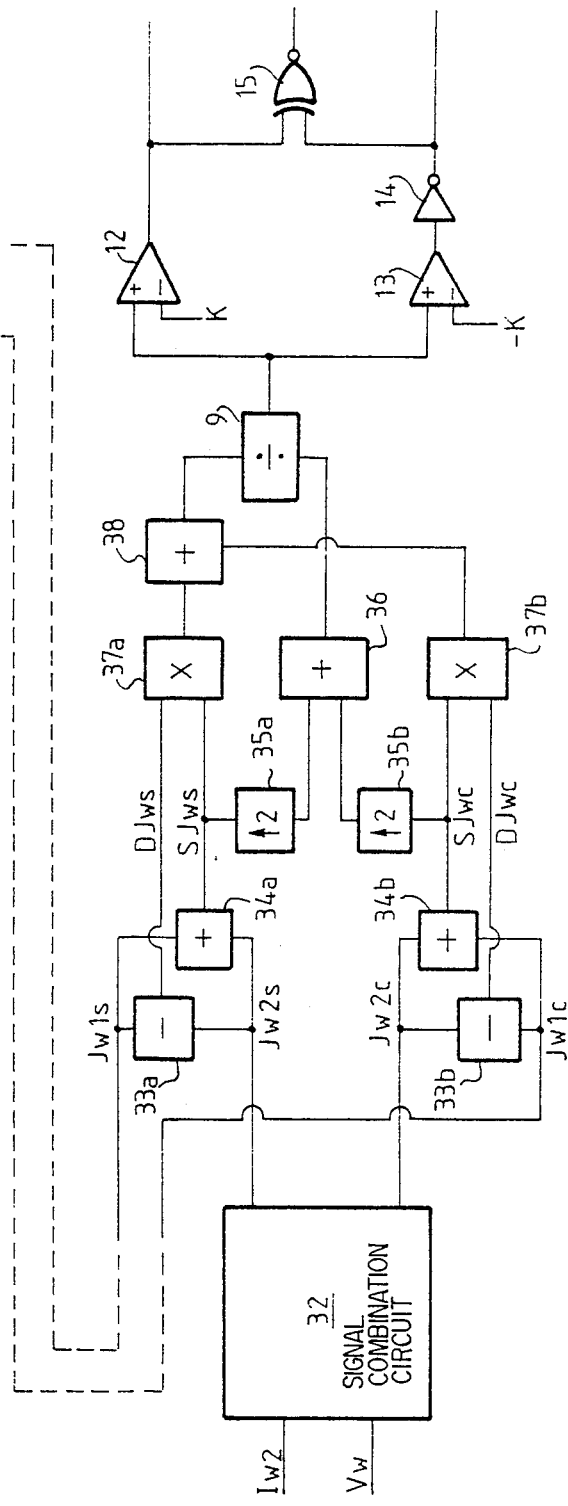
FIG. 6

METHOD AND APPARATUS FOR THE IDENTIFICATION OF A FAULTY CONDUCTOR IN A MULTIPLE SUPPLY LINE

The present invention relates to a method and apparatus for determining in which polyphase group of conductors is a conductor having a fault which is present on a phase of an electricity supply line of at least two polyphase groups the respective phases of which may be connected in parallel at at least one end of the supply line.

The considerable increase in energy consumption has led over several years to the installation of twin supply lines, or to the twinning of existing lines, with the object of securing the transmission of the more important electricity supplies.

The twin lines comprise, taking the case of three phase supply, two groups of three conductors each of which carries one phase, the respective phases of two groups being connectable in parallel at at least one end of the line and normally connected in parallel at the two ends of the line.

These twin supply lines may be the source of simultaneous faults on the phases of the two groups at a common point.

Until now, supply line protection methods, developed for the protection of single lines, that is lines having a single group of three conductors, were not equipped to take account of the possibility of such faults, peculiar to multiple lines.

Moreover, classical methods of identifying a faulty phase, such as those described in U.S. Pat. No. 3,626,281 or U.S. Pat. No. 4,366,474, although satisfactory for the protection of single lines, may give undesirable results in the case of multiple lines.

In particular, referring to FIG. 1, in the case of twin three phase lines, that is comprising two groups 1 and 2 of three conductors respectively assigned to phases a, b, c and connected in parallel at the ends of the lines, two protectors are in place, at each end of the line, on respective groups 1 and 2.

If a fault occurs between conductor a1 of phase a in group 1 and conductor b2 of phase b in group 2, phases a and b together appear faulty, such that conductors a1 and b1 on the one hand and a2, b2 on the other indistinguishly appear as having a fault, which could leave the supply line out of service; clearly such a tripping is undesirable to the extent that, conductors b1 and a2 being sound, that is not affected by the fault, the supply could be maintained in service by virtue of conductors a2, b1, c1 and c2.

Moreover, the lack of information on the identity of the faulty conductor can lead to errors in measuring other parameters about the fault, in particular in the determination of direction indicative of the origin of the fault.

In this regard, the object of the present invention is essentially to provide means for discriminating between sound conductors and faulty conductors in a multiple supply line, that is a line comprising several polyphase conductor groups, in such a way as to permit continuing use of the conductors which, although assigned to a phase generally indicated as at fault, are not themselves subject to the fault.

To this end, a method in accordance with the present invention includes the steps of:

establishing, at a measurement point on a line, first and second current signals proportional to instantaneous values of current passing in first and second conductors which, respectively belonging to first and second groups, are the conductors associated with a faulty phase, deriving process signals representative of combinations of the first and second current signals, performing a comparison operation or equivalent operation to comparison with a threshold level defining a level of asymmetry expressed as a function of said process signals and representative of the asymmetry of distribution, between the first and second conductors, of current in the faulty phase, and deriving at least a first output signal indicating how sound the conductor associated with the current signal having the lowest modulus is, subject to said asymmetry value exceeding, in absolute value, said predetermined threshold level.

Preferably, the asymmetry value is proportional to the product, given by the cosine of the phase angle between the difference and the sum of the first and second current signals, and the modulus of the difference of the current signals expressed as a function of the modulus of their sum.

For this, the derivation of the process signals comprises for example deriving a first process signal as a function of the difference between the first and second current signals, and deriving a second process signal as a function of the sum of the first and second current signals.

More specifically, the methods generally comprises deriving first and second output signals, identifying the first and second conductor, as the sound conductor or the faulty conductor, according to whether said asymmetry level is negative, or positive, subject to that level being, in absolute terms, greater than said fixed threshold level.

The method may moreover include the deriving a third output signal identifying the two conductors as being both subject to the fault if said asymmetry level is, in absolute terms, less than said predetermined threshold.

The comparison operation includes for example firstly derivation of at least a first compound signal proportional to the difference between the first process signal and the product of said threshold value with the second process signal, and secondly a first elementary comparison operation comprising essentially of comparing the respective polarities of the first compound signal with the second process signal.

The comparison operation may further include the steps of firstly deriving a second compound signal proportional to the sum of the first process signal and the product of said threshold value and the second process signal, and, secondly, a second elementary comparison operation essentially comprising of comparing the respective polarities of the second compound signal and the second process signal.

In this method, applied to the protection of a section of supply line of which the length represents a fraction of the total line length, and which resides downstream of a measurement point and upstream of a protection boundary, the threshold is preferably chosen, in absolute value, to be substantially equal to the relationship of a first value represented by the complement with respect to one of said fraction of the total line length, to a second level representing the percentage, in relation to the total line impedance and connected services, to the impedance appearing downstream of the protection boundary.

In a preferred implementation, the process includes deriving, as well as the process signals, first and second current transition signals each of which is, at any instant, proportional to the difference between the value at that instant of the respective current signal and the value that current signal would have had at that instant in the absence of the fault.

In the case where the process signals vary with time as a function of instantaneous values of the modulus and phase angle of the first and second current signals, said comparison operation is performed at the moment when the second process signal takes on a limiting value.

However, in an alternative implementation, the process of the present invention may also include deriving as well as the first and second process signals, scalar process signals which only are subject to time variation as a function of the modulus of the first and second current signals.

The process for determining in which respective group the conductors subject to faults in at least two phases of an electricity supply line of two groups in which the respective phases are connected in parallel are, preferably comprises of implementing, for each faulty phase, the method described above.

Apparatus in accordance with the present invention includes:

combination means for providing process signals representative of combinations of a first and second current signals, these being proportional to instantaneous values of current passing in first and second conductors which, respectively belonging to first and second groups, are the conductors associated with a faulty phase, means for performing a comparison operation or equivalent operation to comparison with a threshold level defining a level of asymmetry expressed as a function of said process signals and representative of the asymmetry of distribution, between the first and second conductors, of current in the faulty phase, and means for deriving at least a first output signal indicating how sound the conductor associated with the current signal having the lowest modulus is, subject to said asymmetry value exceeding, in absolute value, said predetermined threshold level.

The means for deriving the process signals generally include means for deriving a first process signal as a function of the difference of the first and second current signals and means for deriving a second process signal as a function of the sum of the first and second current signals.

Figure 4:
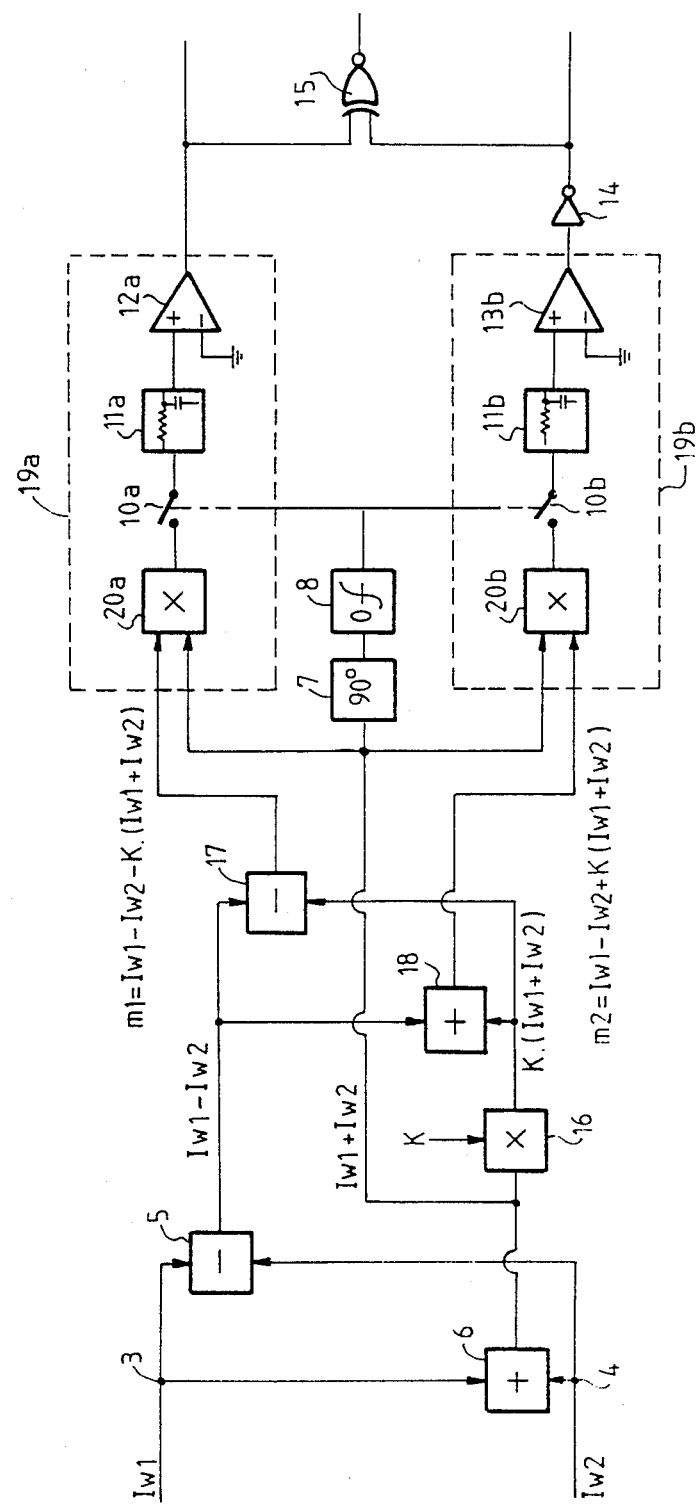
Figure 5:
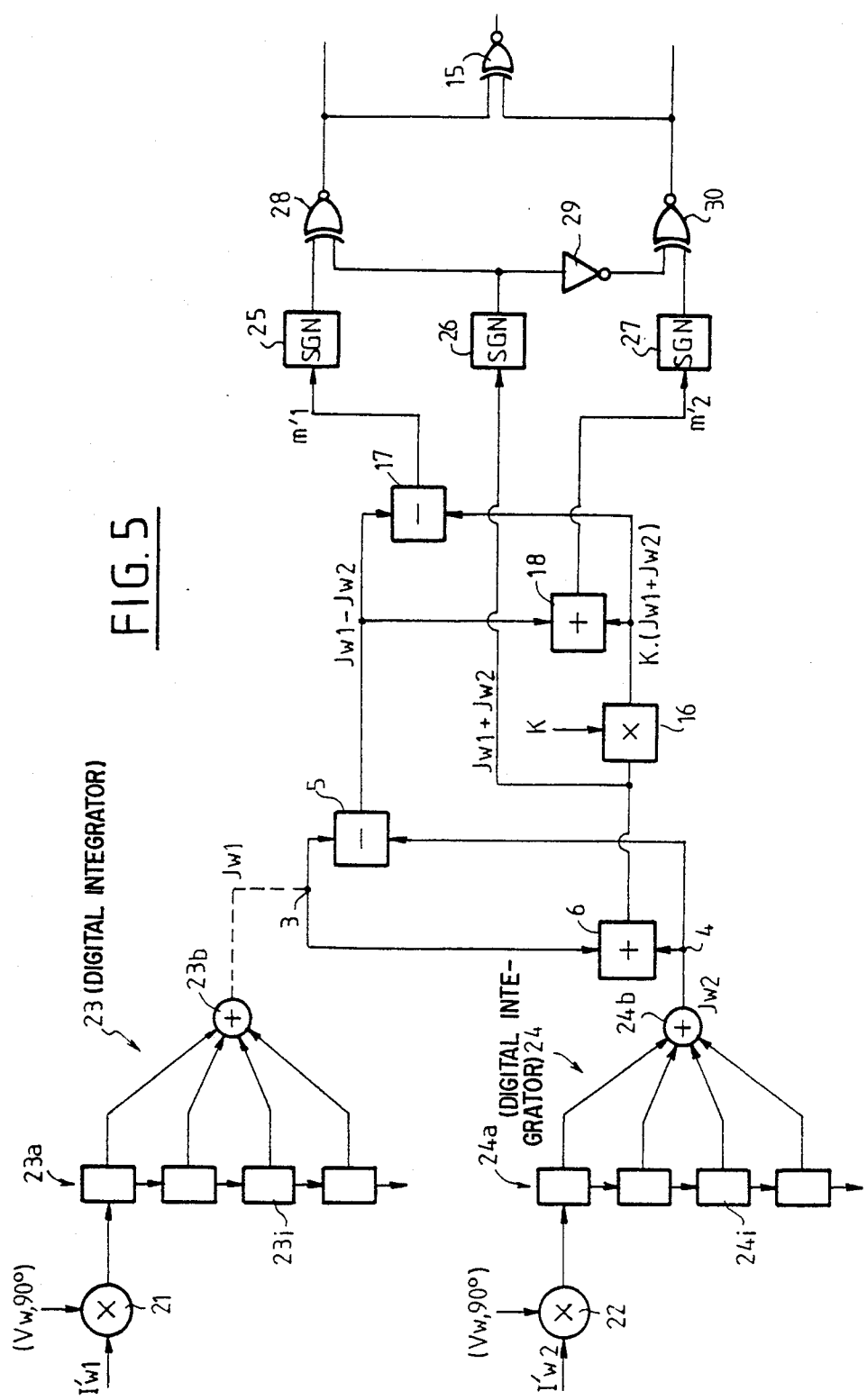

Several features of detail of the implementation of the invention will be described hereinafter, by way of example only, with reference to the accompanying drawings, of which:

FIG. 1 represents a twin three phase electricity supply line,

FIGS. 2A to 2D, together making up FIG. 2 are vectorial representations of electrical signals present in the method and apparatus of the present invention, FIG. 3 is a schematic of a first embodiment of the present invention, FIG. 4 is a schematic of a second embodiment of the present invention, FIG. 5 is a schematic of a third embodiment of the present invention, useful in a particular application, FIG. 6 is a schematic of a fourth embodiment of the present invention, related to that of FIG. 5 but for general application.

The electricity supply line of FIG. 1 comprises two groups 1 and 2, that is two polyphase groups 1 and 2 of conductors, which are connected in parallel at the two ends A and B of the line, and of which each is assigned to one of the phases of a set of three phases a, b and c.

The line is, at its respective ends A and B, connected to three phases electricity supplies S and P, respectively having impedances $Z_s$ and $Z_p$.

Protection apparatus, or monitoring circuits, RA1, RA2, RB1 and RB2 are arranged on the line at the two ends A, B and on the two conductor groups 1 and 2 thereof.

The monitoring circuits may be of known type and for example in accordance with the inventions protected by U.S. Pat. Nos. 3,626,281 or 4,366,474.

In particular, the monitoring circuits derive and use current and voltage signals which, at measurement locations corresponding to the placement of the monitoring circuits on the line give a picture of its electrical state.

Thus the monitoring circuits RA1 and RA2 provide a set of three voltage signals Va, Vb, Vc representative of the respective potentials of the phases a, b, and c at the end A of the line, and also each give three current signals $I_{a1}$, $I_{b1}$, $I_{c1}$, for RA1 and $I_{a2}$, $I_{b2}$, $I_{c2}$, for RA2, proportional to the instanteneous values of the currents, at the A end of the line, respectively in groups 1 and 2.

Relays RB1 and RB2 provide and use analogous signals at the B end of the supply line.

By means of the signals, or at least some of them, the monitoring circuits RA1, RA2, RB1 and RB2 may, in the case of a line fault, identify broadly the or those phases subject to the fault. For example, in the case of a fault between conductors $a_1$ and $b_2$ the monitoring circuits RA1 and RA2 will broadly indicate that phases a and b are faulty.

The object of the present invention is to provide means for discriminating, amongst the conductors assigned to a single faulty phase, which are sound (if any) from which are at fault, so that, for example in the case of a fault a1, b2, conductors b1 and a2 can be kept in service.

In FIG. 2, the symbol w indicates a faulty phase, which may be phase a, phase b or phase c (that is w=a, b, c), and the suffixes 1 and 2 indicate the groups. As a result, $w_1$ for example indicates the conductor which, in group 1, is assigned to the phase w which has a fault; furthermore, signals designated by Iw1 and Iw2 are current signals corresponding to the w phase, identified as faulty, and respectively indicating groups 1 and 2. For example, for the case of an $a_1$ $b_2$ fault, leading monitoring circuits RA1 and RA2 to indicate phases a and b as faulty, signal Iw1 may be the current signal $I_{a1}$, used by monitoring circuit RA1 (or signal $I_{b1}$), and signal Iw2 may be the current signal $I_{a2}$ used by monitoring circuit RA2 (or signal $I_{b2}$).

Signals Iw1 and Iw2 are assumed to be derived at the same location, that is either monitoring circuits RA1 and RA2 are physically very close or overlapped, or at least one of the two signals is transmitted to a location at which the other signal is derived.

Signals Iw1 and Iw2 being proportional to the instantanous values of the currents respectively present in the conductors w1 and w2 of the supply line, change as time passes in relation to the instantaneous respective values of the modulus and phase angle of the currents.

For this reason, the current signals Iw1 and Iw2, like certain other signals to be described below, are represented in FIG. 2 in the form of vectors.

It is appropriate, for a better understanding of the invention to review the principles and the basis of such a vectorial representation, generally used in the art.

Periodic signals, and in particular sinusoids such as the supply line currents and the current signals Iw1 and Iw2, may be represented by a modulus M (also called amplitude), a frequency F, and an initial phase angle p.

At any time t, such a periodic signal takes a value:

$M.\cos(2PI.F.t + p)$ where cos stands for the cosine function and $PI = 3.14159$.

Such a value may also be expressed at any time as the component, given a horizontal real number axis, of a vector of modulus M (represented by vector length), making initially (that is at $t=0$) an angle p with the real axis, and rotating anti-clockwise with frequency F about its origin.

"Instantaneous phase angle" expresses as the angle $2.PI.F.t + p$ that the vector makes with the real axis at a time of interest t.

"Polarity" of the periodic signal is the sign of the function $\cos(2.PI.F.t + p)$ at the time of interest.

The periodic signal thus has a positive or negative polarity according to whether the vector which represents it points to east or west at the time of interest.

Lastly "algebraic value of a vector" means the product of its modulus and its polarity, and "the projection of a vector in a predetermined direction "means the algebraic value of a vector parallel to that direction, having the same attitude as the vector to be projected, and of which the modulus is equal to the product of the modulus of the vector to be projected and the cosine of the angle formed between the vector to be projected and said direction.

For convenience, the same notation will be used, in the present description, for designating signals identifying physical variables and for the vectors which represent them.

Currents in conductor groups 1 and 2 having the same frequency, the angle between the vectors Iw1 and Iw2 of FIG. 2 is invariant with time.

As well as currents Iw1 and Iw2, FIG. 2 shows the signals Iw1−Iw2 and Iw1+Iw2 which will be respectively designated hereinafter as first and second process signals.

Although in this case the first and second process signals Iw1−Iw2 and Iw1+Iw2 may be represented by linear combinations of the current signals Iw1, and Iw2, this feature is not essential for the invention to be implemented.

For example, these process signals could be formed respectively by the difference and the sum of signals proportional to the respective time derivatives of the currents in conductors w1 and w2; they could also be made up by the difference and sum of current transition signals, such as those used in U.S. Pat. No. 4,366,474; they could yet be formed respectively by the difference and sum of signals corresponding to time derivatives of such current transition signals.

Other examples of process signals will be given by reference to different embodiments of the invention, presented for the purpose of illustration.

Nevertheless FIG. 2, which allows understanding of the basic concept of the invention, will be described using the current signals Iw1 and Iw2 and, for the first and second process signals, their difference Iw1−Iw2 and their sum Iw1+Iw2.

Figure 2A:
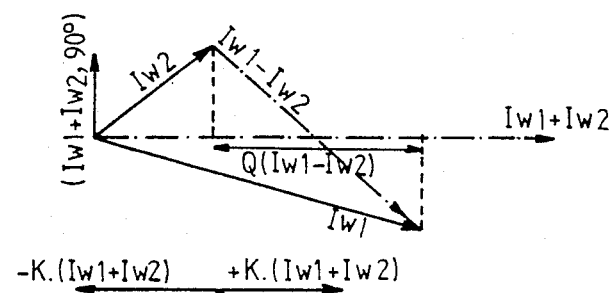
Figure 2B:
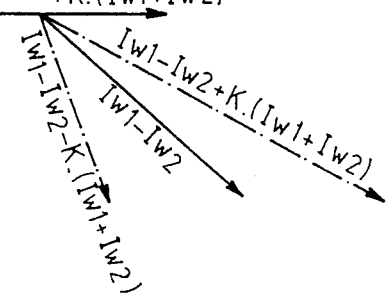
Figure 2C:
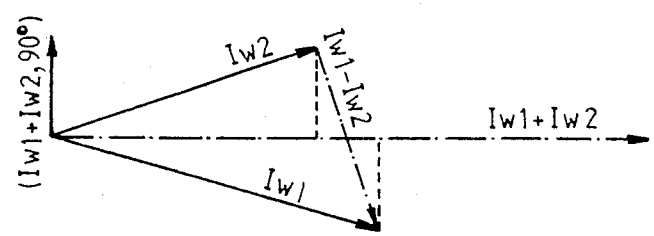
Figure 2D:
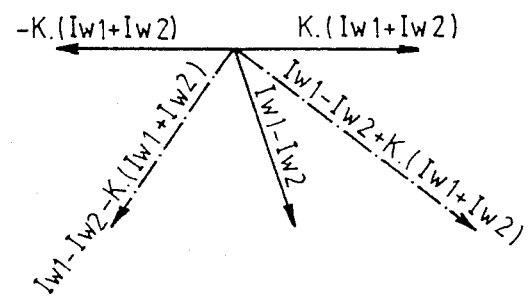

FIGS. 2A and 2B illustrate a first example, and FIGS. 2C and 2D another.

The invention, as illustrated by these figures, essentially comprises deriving, from the current signals Iw1 and Iw2, first and second process signals Iw1−Iw2 and Iw1+Iw2, for comparison with a threshold K, normally lying between 0.2 and 0.3, being a degree of asymmetry the absolute value of which is all the greater for the distribution of current of the faulty phase w between the conductors w1 and w2 being less symmetrical, this level being represented in FIGS. 2A and 2C as being proportional to the projection on the second process signal Iw1+Iw2 of the first process signal Iw1−Iw2, and the modulus of the second process signal, and identifying the conductor w1 or w2 having the lowest modulus as sound, provided that the level of asymmetry is, in absolute value, greater than the threshold K.

More particularly, if $Q(Iw1-Iw2)$ designates the projection of Iw1−Iw2 upon Iw1−Iw2 and if $M(X)$ represents the algebraic value of vector X, the invention therefore would indicate as sound the conductor associated with the current signal having the lowest modulus provided that the asymmetry $R = Q(Iw1-Iw2)/M(Iw1+Iw2)$ is, in absolute value, at least about 0.2.

In FIG. 2A, the current signal of lowest modulus is Iw2 and the relationship $R = Q(Iw1-Iw2)/M(Iw1+Iw2)$ is of the order of 0.5; conductor w2, that is the conductor assigned to phase w in conductor group 2, is therefore indicated as sound.

By contrast, in FIG. 2C, the current signal of lowest modulus is again Iw2, but the relationship $R = Q(Iw1-Iw2)M/(Iw1+Iw2)$ is only of the order of 0.1; the conductor w2 cannot therefore be indicated as sound, from which it may be deduced that the fault on phase w affects conductors w1 and w2.

If, in FIG. 2A, signal Iw2 took the place of signal Iw1 and vice versa, nothing would be altered except the polarity of the first process signal Iw1−Iw2, which would become negative.

It is therefore possible by using only the first and second process signals, not only to detect, when it is the case, that conductor w2 is sound, but also to detect, when appropriate, that conductor w1 is sound.

In fact, if the asymmetry value $R = Q(Iw1-Iw2)/M(Iw1+Iw2)$ is greater than the threshold K, the conductor w2 is sound, and if this level is less than the inverse −K of the threshold K, conductor w1 is sound. In these two cases, the absolute value of the asymmetry value is greater than the threshold K. If, by contrast, the absolute value of this value is less than the threshold K (as in FIG. 2C), the two conductors w1 and w2 are to be presumed faulty.

It will be noticed that in FIGS. 2A and 2C the second process signal Iw1+Iw2 is represented by a horizontal vector, that is overlaying the real axis.

This condition arises only twice per each period of the current signals Iw1 and Iw2, in fact at the moment when the second process signal Iw1+Iw2 passes through a limiting value, that is when the instantaneous value of the signal (Iw1−Iw2, 90°); representing the second process signal shifted in phase by 90°, is zero.

FIG. 3 represents apparatus for implementing invention as thus far described.

Signals Iw1 and Iw2 arrive at two inputs 3, 4 of the apparatus and feed two amplifiers 5, 6 the first of which provides the first process signal Iw1−Iw2 and the second of which provides the second process signal Iw1+Iw2. A phase shift network 7 receives the signal Iw1+Iw2 and yields a signal, which may be referred to as a "pilot signal" and denoted as (Iw1+Iw2, 90°), this signal being obtained from the second process signal Iw1+Iw2 by a phase shift of 90°, resulting for example from a time differentation of the second process signal.

The pilot signal (Iw1+Iw2, 90°) feeds a zero crossing detector 8 which provides a pulse output each time the pilot signal traverses zero.

The first and second process signals feed a divider 9 which provides a signal representative of the instantaneous value of the relationship $r=(Iw1-Iw2)/(Iw1+Iw2)$ to a commutator 10.

The commutator 10 which enables or disables the input to a sample and hold circuit 11, is controlled by the pulsed output of zero crossing detector 8 so as to be closed during the pulse.

Thus, sample and hold circuit 11 stores the value of the function r at the instant the pilot signal (Iw1+Iw2, 90°) tranverses zero, that is at the moment when the second process signal Iw1+Iw2 reaches a limiting value, i.e. when the latter signals is represented by a horizontal vector, as in FIGS. 2A and 2C.

At this moment, the projection Q(Iw1−Iw2) of the first process signal Iw1−Iw2 on the second Iw1+Iw2 is simply equal to the first process signal, and the algebraic value M(Iw1+Iw2) of the second process signal (Iw1+Iw2) is equal to the second process signal.

As a consequence, at this instant, the relationship $r=(Iw1-Iw2)/(Iw1+Iw2)$ represents the asymmetry value $R=Q(Iw1-Iw2)/M(Iw1+Iw2)$.

The magnitude of this value R, stored in sample and hold circuit 11, is compared with the threshold K and its inverse value −K, in two comparators 12 and 13 respectively.

The output signal of comparator 12 is at a low level whenever the value R is below the threshold K, and at a high level at other times. A high output signal level, as represented in FIG. 2A, indicates that the fault detected in phase w is affecting conductor w1, but is not affecting conductor w2.

The output signal of comparator 13 is at a low level whenever the value R is less than the inverse −K of the threshold K, and at a high level at other times. The comparator 13 is followed by an inverter 14 which inverts the levels of the comparator. A high output signal level from inverter 14 indicates that the fault detected on phase w is affecting conductor w2 and is not affecting conductor w1.

The output signal of comparator 12 and inverter 14 feed an EXCLUSIVE NOR logic gate 15, which provides a signal at a high level only when the output signals from the comparator 12 and the inverter are at the same level. A high signal at the output of gate 15 therefore indicates that the conductors w1 and w2 are in the same condition with respect to a fault; if a fault has been detected on phase w of a three phase twin supply line, a high level output from gate 15 indicates that therefore both conductors w1 and w2 are affected by the fault; this situation, which is shown in FIG. 2C, corresponds to the condition in which the asymmetry value R is, in absolute value, less than the threshold K.

The threshold level K is a function of the characteristics of the supply line and of the sources S and P to which it is connected, as well as the length of the section of line to be protected, that is the length of the section for which a capability is required to detect, in the case of a fault affecting that section, the possible existence of a sound conductor.

Working from the A end of the supply line, which is the measurement point where monitoring circuits RA1 and RA2 are placed, protection may be required for a section length T (FIG. 1) running from the measurement point A. The end of the section T, which is at the distant from the point A is called the "protection limit" and this arrangement is referred to in the art as the section T extending downstream from a measurement point and upstream of a protection limit.

If L represents the total line length, $Z_{sd}$ the upstream source impedance for the point A, that is of the source S, $Z_{pd}$ the downstream source impedance for the point A, that is of the source P and $Z_d$ the resistivity of the line, it is apparent that the impedance q downstream of the protection limit, that is apart from the section T, expressed as a fraction of the total impedance of the line and sources S and P is:

$$Q=[2Z_{pd}+(L-T).z_d]/[2Z_{pd}+2Z_{sd}+L.z_d].$$

This being the case, the threshold level K is chosen to be equal or at least close to a function of a first level $g=1-t$, of the fraction q.

Put another way:

$$K=(1-t)/q$$

The first level $g=1-t$ is equal to the complement with respect to 1 of the fraction t of the line length which the section length T represents. In other words, $g=1-(T/L)$ or $g=(L-T)/L$, which may also be written as: $K=(L-t)L.q$.

For example, if L=100 km, T=88 km, $Z_{pd}=Z_{sd}=20$ ohms and zd=0.3 ohm/km, q is equal to 0.396, t=0.88, g=0.12 and K is therefore chosen to be of the order of 0.12./0.396, that is in the region of 0.3.

For K=0.3, the method of the present invention allows, in this numerical example, the possible existance of a sound conductor in the case of a fault arising up to a distance X from point A, which is less than T=88 km to be tested.

Conversely it can be shown that if L=100 km, $Z_d=0.3$ ohm/km, $Z_{sd}=20$ ohms, $Z_{pd}=200$ ohms and if K is chosen equal to 0.3, the method of the invention would allow detection of the possible existence of a healthy conductor in the case of a fault affecting a section of line of length T equal to 74 km.

FIG. 4 shows a first alternative to the embodiment shown in FIG. 3, also illustrated by FIGS. 2A to 2D.

Although the apparatus of FIG. 4 appears different from that of FIG. 3, both apparati, in common with those of FIGS. 5 and 6, effect the same method and are therefore equivalent in their functional objective, which is the detection of a possibly sound conductor.

In detail, the difference between the apparatus of FIGS. 3 and 4 is as follows: the embodiment of FIG. 3 actually derives the asymmetry level $R=Q(Iw1-Iw2)/M(Iw1+Iw2)$ and compares it with the threshold level K and its inverse −K, whilst the embodiment of FIG. 4 only implicitly derives the asymmetric value in the form of compound signals (Iw1−Iw2)−K.(Iw1-

$+Iw2$) and ($Iw1-Iw2$)+($Iw1+Iw2$) the polarity of which is compared with that of $Iw1+Iw2$.

In the embodiment of FIG. 4, nodes 3 and 4, amplifiers 5 and 6 deriving respectively the first and second process signals $Iw1-Iw2$ and $Iw1+Iw2$, as well as phase shift network 7 shifting by 90° the phase of the second process signal, and zero crossing detector 8, may be identified.

This embodiment also comprises an amplifier 16 of gain K receiving the second process signal $Iw1+Iw2$ and providing an intermediate signal $K.(Iw1+Iw2)$, and two further amplifiers 17, 18 receiving the intermediate signal and the first and second compound signals $m1=Iw1-Iw2-K(Iw1+Iw2)$ and $m2=Iw1-Iw2--K/Iw1+Iw2)$.

The compound signals are fed to two phase sensitive detectors 19a and 19b which also receive the second process signal $Iw1+Iw2$.

Phase sensitive detectors 19a and 19b are controlled by the pilot signal ($Iw1+Iw2$, 90°) provided by zero crossing detector 8, each of which serves to provide, at the instant the pilot signal traverses zero, a high signal if the compound signal and the second process signal fed to its input are, in absolute terms, out of phase by less than 90°, the output signal being low at other times.

By way of example, phase sensitive detector 19a comprises a mixer 20a receiving the first compound signal m1 and the second process signal, a commutator 10a arranged at the output of the mixer and controlled by the pilot signal in the same way as was the commutator 10 of FIG. 3, a sample and hold circuit 11o, analoguous to sample and hold circuit 11, and a comparator 12a comparing the output signal of the sample and hold circuit 11a with zero. The phase sensitive detector 19b comprises analogous elements, represented as multiplier 20b, commutator 10b, sample and hold circuit 11b and comparator 13b. The output of the second phase sensitive detector 19b is connected to an inverter 14, analogous to inverter 14 of FIG. 3.

For the case where only conductor w1 is faulty (as in FIG. 2B), the absolute phase difference between the second process signal $Iw1-Iw2$ and the first compound signal $m1=Iw1-Iw2-K(Iw1+Iw2)$ is less than 90°, which indicates that the signals have the same polarity (positive for the case of FIG. 2 since the associated vectors both point east), which further indicates that their product is positive; therefore the output signals of multiplier 20a and of sample and hold circuit 11a are positive, so that the output of comparator 12a is high.

For the case where only conductor w2 is affected by the fault, the second compound signal $m2=(Iw1-Iw2)+K(Iw1+Iw2)$ and the second process signal $Iw1+Iw2$ are of opposite polarity, so that the output of comparator 13b is low and the output of inverter 14 high.

Finally, EXCLUSIVE NOR gate 15, analogous to gate 15 of the embodiment of FIG. 3, provides a low output signal whenever conductors w1 and w2 are in different states (FIGS. 2A and 2B), that is whenever one is sound and one is at fault, and at a high level when the conductors are in the same state (FIGS. 2C and 2D).

FIG. 5 represents a third embodiment for implementing the invention. The difference between this embodiment and those of FIGS. 3 and 4 is essentially one of structure and stems from the fact that the embodiment of FIG. 5 uses scalar process signals, as will be explained in detail hereinafter: in terms of objective, and inventive concept, the embodiment of FIG. 5 is equivalent to the embodiments of FIGS. 3 and 4 except that the embodiment only functions in the case where the fault resistance appearing on phase w is relatively low.

FIG. 6 shows a similar embodiment to FIG. 5, but which functions whatever the fault resistance might be.

As well as first and second process signals $Jw1-Jw2$ and $Jw1+Jw2$, which parallel signals $Iw1-Iw2$ but which will be described in more detail hereinafter, the embodiment of FIG. 5 uses several further process signals.

At its inputs, this embodiment receives special process signals I'w1 and I'w2 which will hereinafter be referred to as first and second current transition signals.

The first current transition signal I'w1 is derived as being equal or at least proportional to the difference between the instantanous value of the first current signal Iw1 and the value iw1 which the current signal Iw1 would have had at the same instant in the absence of a fault. The second current transition signal I'w2 is derived in similar fashion. The use of such current transition signals is known in the art, and is described for example in U.S. Pat. No. 4,366,474.

The embodiment of FIG. 5 uses moreover a reference signal (Vw,90°) derived by shifting by 90° an initial reference signal Vw. In the particular case of the embodiment of FIG. 5, the initial reference signal Vw is given by that phase voltage w, as it would have been in the absence of a fault on the phase. The signal Vw is therefore derived, like current signal iw1, by extrapolation following the onset of a fault, of the phase voltage signal w as it was recorded by monitoring circuit $RA_1$ (or, if appropriate, by monitoring circuit $RA_2$ if the voltage signal is common to conductor groups 1 and 2) before the fault.

The embodiment of FIG. 5 comprises two mixers 21 and 22 arranged to form the products I'w1.(Vw,90°) and I'w2.(Vw,90°) respectively.

The embodiment moreover comprises two integrators 23 and 24 in the form of analogue integrators or, as shown in FIG. 5 in the form of digital integrators. In the latter case each integrator 23, 24 comprises firstly a shift register such as 23a or 24a, the different stages such as 23i or 24i of which store successive instantaneous values of the product I'w1.(Vw, 90°) or I'w2.(Vw, 90°), and secondly an adder such as 23b or 24b forming the sum of the values contained in the various stages of the associated shift register. The length of shift registers 23a, 24a is such that the registers contain a group of success instantaneous product values which have been derived over a time span equal to a multiple of the half cycle period of the initial reference signal Vw.

Adders 23b and 24b thus provide signals Jw1 and Jw2 respectively which are represented by the integrals, or discrete sums, over a time span equal to or a multiple of the half-cycle period of the reference (Vw, 90°), of the scalar product of the reference signal multiplied by the first and second current transition signals I'w1 and I'w2.

Signals Jw1 and Jw2 are connected via nodes 3, 4 of the embodiment, to two amplifiers 5, 6 the first of which provides the difference signal $Jw1-Jw2$ and the second of which provides the sum signal $Jw1+JW2$.

As has already been stated, signals $Jw1-Jw2$ and $Jw1+Jw2$ which will be referred to as "first and second scalar process signals", are equivalent to the first and second process signals $Iw1-Iw2$ and $Iw1+Iw2$ described with reference to FIGS. 3 and 4.

However, unlike signals $Iw1-Iw2$ and $Iw1+Iw2$, which vary with time as a function of the instantaneous value of the modulus and phase angle of signals Iw1 and Iw2, signals Jw1, Jw2, Jw1−Jw2, and Jw1+Jw2 only vary with time as a function of the modulus of signals I'w1 and/or I'w2.

This difference stems from the fact that signals Jw1 and Jw2 are derived from the scalar product of signals I'w1 and I'w2 multiplied by the signals (Vw, 90°) the frequency of which is the same as that of I'w1 and I'w2.

If the modulus M(I'w1) of the signal I'w1 is like the modulus M(Vw) of signal Vw, constant, signal Jw1 will be equal for example, at any time, to M(I'w1).M/Vw) sin(f) where f is the constant phase difference between I'w and Vw.

Circuits, such as 21 and 23 or 22 and 24, which as an end result provide, thanks to a reference signal such as (Vw, 90°), signals such a Jw1, Jw2, Jw1−Jw2, Jw1+Jw2, being essentially independent of the frequency of the current signals Iw1, and Iw2, may take on other forms, as will be described with reference to FIG. 6.

Signals such as Jw1, Jw2, Jw1−Jw2, Jw1+Jw2, independent of the frequency of signals Iw1 and Iw2 may be advantageously used where monitoring circuit RA1 and RA2 are physically spaced apart one from another, that is where the current signal from one monitoring circuit, for example RA1, has to be transmitted to the other monitoring circuit, for example RA2. The fact of transmitting a signal of the type Jw1, in place of a vector type current signal, such as Iw1, allows avoidance of the need to correct errors introduced into the value of the transmitted signal by virtue of the delay which signal transmission brings.

In addition to means for deriving the first and second scalar process signals Jw1−Jw2 and Jw1+Jw2, the embodiment comprises for example an amplifier 16 of gain K receiving the signal Jw1+Jw2 and providing an intermediate signal K.(Jw1+Jw2). Two further amplifiers 17, 18, receiving this intermediate signal and the first scalar process signal Jw1−Jw2 provide the first and second compound signals $$m'1 = Jw1 - Jw2 - K.(Jw1 + Jw2)$$

and $$m'2 = Jw1 - Jw2 + K.(Jw1 + Jw2)$$

respectively.

The embodiment comprises three polarity detectors 25, 26, 27, respectively receiving the first compound signal m'1, the second scalar process signal Jw1 and Jw2, and the second compound signal m'2. Each polarity detector provides at its output a high signal if the signal received at its input is positive, and a low output signal if the input signal is negative.

An EXCLUSIVE-NOR gate 28 receives at its inputs the output signals of polarity detectors 25 and 26 and therefore provides a high output signal when the polarities of the first compound signal m1 and of the second process signal Jw1+Jw2 are identical, which indicates, as in the case of the embodiment of FIG. 4, that conductor w2 is sound whereas conductor w1 is faulty.

An inverter 29 inverts the level of the output signal of polarity detector 26.

An EXCLUSIVE-NOR gate 30 receives at its inputs the signal output of inverter 29 and the output signal of polarity detector 27; this gate therefore provides a high output signal when the polarities of the second compound signal m2 and of the second process signal Jw1+Jw2 are different, which indicates, as in the case of the embodiment of FIG. 4, that conductor w1 is sound whereas conductor w2 is faulty.

An EXCLUSIVE-NOR gate 15, connected to gates 28 and 30, provides a low output signal when conductor w1 and w2 are in different states, that is when one is faulty and the other sound, and a high output when conductors w1 and w2 are in the same state.

The functional equivalence of the embodiment of FIG. 5 and the embodiments of FIGS. 3 and 4, regarding the objective of indicating a faulty conductor, lies in the fact that, in the intended application of the embodiment of FIG. 5, that is in the case where the resistance of a fault on the phase w is low, the sum I'w1+I'w2 of the current transition signals I'w1 and I'w2 is in phase with the reference signal (Vw, 90°).

This results in the first scalar process signal Jw1−Jw2 having, for a certain length of time following the onset of the fault, the value of the difference I'w1−I'w2 of the current transition signals I'w1 and I'w2 at the exact instant when the sum I'w1+I'w2 of these signals reaches a limiting value.

The embodiment of FIG. 6, which functions whatever the fault resistance, receives at its inputs for example current signals Iw1 and Iw2 and the reference signal Vw.

Instead of signals Iw1 and Iw2, this embodiment could however receive process signals derived from the current signals, for example from current transition signals I'w1 and I'w2, or signals derived by time differentation of either signals Iw1 or Iw2 or signals I'w1 and I'w2, etc.

Moreover, instead of reference signal Vw, the embodiment of FIG. 6 could alternatively use the reference signal (Vw, 90°) previously mentioned, or any other constant amplitude sinusoid, of the same period as the current signals Iw1 and Iw2 and available at the A end of the supply line.

The embodiment comprises two circuits 31 and 32 respectively providing firstly signal Jw1S and Jw1C and secondly Jw2S and Jw2C.

Circuit 31 only is completely shown, circuit 32, identical to circuit 31, being represented simply by a functional block.

Circuit 31 comprises a phase shift network 31a receiving, and phase shifting by 90°, signal Iw1 and a phase shift network 31b receiving and phase shifting by 90° signal Vw. Signals Iw1, Iw2, and output signals (Iw1, 90°) and (Vw, 90°) from phase shift networks 31a and 31b are relayed two at a time to mixers 31c to 31f which respectively provide product signals (Iw1,90°).Vw,Iw1.(Vw, 90°),(Vw,90°) and Iw1.Vw.

The difference between the first two signals is computed by subtractor 31 g which provides the signal $Jw1S = Iw1,90°).Vw - Iw1.(Vw,90°)$ and the sum of the latter two signals is computed by adder 311 which provides the signal $Jw1C = (Iw1,90°).(Vw,90°) + Iw1.Vw$.

Circuit 32 provide analogous signals $$Jw2S = (Iw2,90°).Vw - Iw2.(Vw,90°)$$

$$Jw2C = (Iw2,90°).(Vw,90°) + Iw2.Vw.$$

Designating the phase angle between signals Iw1 and Vw as p1, as p2 the phase angle between signals Iw2 and Vw, as M(Iw1) the modulus of the signals Iw1, as M(Iw2) that of Iw2 and as M(Vw) that of signal Vw, it can be shown that:

$$Jw1S = M(Iw1).M(Vw).\sin p1$$

$$Jw1C = M(Iw1).M(Vw).\cos p1$$

$$Jw2S = M(Iw1).M(Vw).\sin p2$$

$$Jw2C = M(Iw1).M(Vw).\cos p2$$

These four signals Jw1S, Jw1C, Jw2S, Jw2C are therefore the scalar process signals, since they are independent of the frequency of signals Iw1 and Iw2.

Therefore, like signals Jw1 or Jw2 of the embodiment of FIG. 5, signals Jw1C and Jw1S or Jw2C and Jw2S may be straightforwardly transmitted from monitoring circuit RA1 to the other RA2 or vice versa, without giving rise to problems of the correction of errors introduced by transmission delay.

A subtractor 33a and an adder 34a respectively provide signals $DJwS = Jw1S - Jw2S$ and $SJwS = Jw1S + Jw2S$.

In an analogous way, subtractor 33b and an adder 34b respectively provide signals $DJwC = Jw1C - Jw2C$ and $SJwC = Jw1C + Jw2C$.

Signals SJwS and SJwC, respectively squared by blocks 35a, 35b, are then summed by an adder 36.

Signals DJwS and SJwS multiplied together by multiplier 37a whilst signals DJwC and SJwC are multiplied together by multiplier 37b. The output signals DJwS.SJwS and DJwC.SJwC of multipliers 37a and 37b are summed by adder 38.

The output signal of adder 38, representing DJwS.SJwS + DJwC.SJwC, is fed to a divider 9 which divides it by the output signal of adder 36, representing $(SJwS)^2 + (SJwC)^2$.

It may be shown that, by applying mathematical analysis that will be familiar in the art, divider 9 provides, for a certain time following onset of the fault, an output signal equal to the output provided by divider 9 of the embodiment of FIG. 3 at the exact moment when the second process signal Iw1+Iw2 reaches a limiting value.

The output signal of divider 9 of the embodiment of FIG. 6 may therefore be regarded, by virtue of comparators 12 and 13 and logic gates 14 and 15 described above, as if it were the output signal of the divider 9 of the embodiment of FIG. 3.

I claim:

1. In an electricity supply line of at least two polyphase groups the respective phases of which may be connected in parallel at least at one end of the supply line, a method for determining in which polyphase group of conductors of the supply line is a conductor having a fault present thereon, including the steps of:
    establishing at a measurement point on the line, first and second current signals proportional to instantaneous values of current passing in first and second conductors which, respectively, belonging to first and second ones of the polyphase groups, are the conductors associated with a faulty phase;
    combining the first and second current signals to obtain processed signals, each one of said current signals having a modulus and a phase angle;
    generating a reference signal having a threshold level;
    combining said processed signals to obtain an intermediate signal having an asymmetry value corresponding to an asymmetry of distribution of current, between the first and second conductors, in a faulty phase, wherein said asymmetry value is proportional to the product, given by the cosine of the phase angle between the difference and the sum of the first and second current signals, and the modulus of the difference of the current signals expressed as a function of the modulus of their sum;
    comparing said intermediate signal level with said threshold level; and
    deriving at least a first output signal indicating as being sound the conductor associated with the current signal having the lowest modulus provided that said asymmetry value exceeds, in absolute value, said threshold level.

2. A method as claimed in claim 1, wherein said step of combining comprises deriving a first of said processed signals as a function of the difference between the first and second current signals, and deriving a second of said processed signals as a function of the sum of the first and second current signals.

3. A method as claimed in claim 1, further comprising the steps of deriving first and second output signals, identifying the first and second conductors as a sound conductor or faulty conductor, according to whether the asymmetry value is negative or positive, subject to that level being, in absolute terms, greater than said threshold level.

4. A method as claimed in claim 3, further including the step of deriving a third output signal identifying the first and second conductors as being both faulty if said asymmetry value is, in absolute terms, less than said threshold level.

5. A method as claimed in claim 2, wherein said step of comparing includes deriving a first compound signal proportional to a difference between the first processed signal and the product of said threshold level and said second processed signal and comparing respective polarities of the first compound signal with the second processed signal.

6. A method as claimed in claim 5, wherein said step of comparing further includes the steps of deriving a second compound signal proportional to the sum of the first processed signal and the product of said threshold level and the second processed signal, and comparing respective polarities of the second compound signal and the second processed signal.

7. A method as claimed in claim 1, applied to protection of a section of a supply line of which the length of the section represents a fraction of the total length of the supply line, and which resides downstream of a measurement point and upstream of a protection boundary, further comprising selecting a threshold level, in absolute value, to be substantially equal to a relationship of a first level represented by the complement with respect to one of said fraction of the total line length, to a second level representing the percentage, in relation to the total line impedance and connected services, to an impedance appearing downstream of the protection boundary.

8. A method as claimed in claim 1, wherein the step of combining includes deriving first and second current transition signals proportional to a difference between an instantaneous value of the respective current signal and the value that the current signal would have had at the same instant in the absence of a fault.

9. A method as claimed in claim 2, wherein said processed signals vary with time as a function of the instantaneous values of the modulus and phase angle of the first and second current signals, said step of comparing being performed at the moment when the second processed signal takes on a limiting value.

10. A method as claimed in claim 1, including the additional step of deriving scalar process signals subject only to time variation as a function of the modulus of the first and second current signals.

11. For an electricity supply line having at least two polyphase groups, respective phases of which may be connected in parallel at least at one end of said supply line, apparatus for determining in which polyphase group of conductors is a conductor having a fault which is present on a phase of said electricity supply line, including:

means for detecting first and second current signals, each of said current signals having a modulus and phase angle;

combining means for providing processed signals representative of a combination of said first and second current signals that are proportional respectively to instantaneous values of current passing through first and second conductors which, belonging respectively to first and second ones of said groups, are the conductors associated with a faulty phase;

means for comparing a threshold level defining a value of asymmetry expressed as a function of said processed signals and representative of an asymmetry of distribution, between the first and second conductors, of current in a faulty phase, said asymmetry value being proportional to the product, given by the cosine of the phase angle between the difference and the sum of the first and second current signals, and the modulus of the difference of the current signals expressed as a function of the modulus of their sum; and means for deriving at least a first output signal indicating whether the conductor associated with the current signal having the lowest modulus is sound, subject to said asymmetry value exceeding, in absolute value, said threshold level.

12. Apparatus as claimed in claim 11, wherein said combining means comprises means for deriving a first processed signal as a function of the difference between the first and second current signals, and means for deriving a second processed signal as a function of the sum of the first and second current signals.

* * * * *